United States Patent [19]

Lattimore et al.

[11] Patent Number: 5,615,168
[45] Date of Patent: Mar. 25, 1997

[54] METHOD AND APPARATUS FOR SYNCHRONIZED PIPELINE DATA ACCESS OF A MEMORY SYSTEM

[75] Inventors: George M. Lattimore, Austin; Michael K. Ciraula, Round Rock; Manoj Kumar; Joseph M. Poplawski, Jr., both of Austin, all of Tex.; Dieter F. Wendel, Schoenaich; Friedrich Wernicke, Holzgerlingen, both of Germany

[73] Assignee: International Business Machines Corporation, Armonk, N.Y.

[21] Appl. No.: 538,085

[22] Filed: Oct. 2, 1995

[51] Int. Cl.⁶ ................................................. G11C 7/00
[52] U.S. Cl. ........................................... 365/233; 365/203
[58] Field of Search .................................. 365/233, 205, 365/49, 191, 203

[56] References Cited

U.S. PATENT DOCUMENTS

| 4,539,661 | 9/1985 | Oritani | 365/230 |
|---|---|---|---|
| 5,132,931 | 7/1992 | Koker | 365/233 |
| 5,337,271 | 8/1994 | Kawahara | 365/203 |
| 5,367,481 | 11/1994 | Takase | 365/203 |
| 5,426,610 | 6/1995 | Childers | 365/205 |
| 5,430,672 | 7/1995 | Kuwabara | 365/203 |

OTHER PUBLICATIONS

IBM Technical Disclosure Bulletin, vol. 21, No. 2, Jul. 1978.

*Primary Examiner*—David C. Nelms
*Assistant Examiner*—Son Mai
*Attorney, Agent, or Firm*—Jenkens & Gilchrist

[57] ABSTRACT

A method and apparatus for providing single clock cycle pipelined access of a memory system, which combines synchronization and self resetting techniques, includes an array of memory cells that are arranged into columns and rows and intercoupled by bit lines and word lines. The memory system also includes an address decoder and a sense enable circuit. The address decoder, upon receiving an address, interprets the address to enable a particular word line, or word lines, and to disable precharging of a bit line, or bit lines. With the word line active, the sense enable circuit generates a sense enable signal when the clock signal has encountered a transitional edge, or is in an active state. When the sense enable signal is active, the sense amplifier reads the data from the addressed memory cell via the bit lines to produce output data.

16 Claims, 6 Drawing Sheets

FIG. 3

FIG. 6

METHOD AND APPARATUS FOR SYNCHRONIZED PIPELINE DATA ACCESS OF A MEMORY SYSTEM

TECHNICAL FIELD OF THE INVENTION

This invention relates generally to memory systems and, more particularly, to synchronized pipeline data accessing of such memory systems.

BACKGROUND OF THE INVENTION

Memory systems are known to comprise a plurality of memory cells which are coupled into rows and columns by bit lines and word lines. Each of the memory cells stores digital information, i.e., a logic 1 or a logic 0. To read the digital information from a memory cell, an associated bit line and word line are activated. When activated, the word line couples the bit line to a sensing amplifier, wherein the bit line provides the digital information of the memory cell to a sensing amplifier. As is also known, the sensing amplifier couples the digital information of the memory system to the external components, such as a central processing unit, data processor, etc. As is further known, the memory system may be used in a plurality of applications, such as computers, communication equipment, and any other type of digital circuitry.

To enhance the ability to read data from a memory cell, many memory systems include a pair of bit lines coupled to the memory cell. One of the bit lines functions as the complement of the other wherein both bit lines are provided to a differential sense amplifier. By using the differential bit lines, or complementary bit lines, in conjunction with a differential sense amplifier, data can be more accurately, and more quickly, read from the memory cell. To read the digital information stored in a memory cell accurately, the complementary bit lines must produce a differential voltage in the range of 100 millivolts to 500 millivolts.

There are currently two primary techniques for reading the digital information from a memory cell: a synchronized technique and a self-resetting technique. The synchronized technique utilizes the clock signal to enable the word line and disable precharging of the bit line. At the next clock transition, a sense enable signal is generated which enables the sense amplifier to read the information from the bit lines. While the synchronization technique allows digital information to be read in a pipeline fashion, the technique is not without limitations. For example, as the clock frequency increases, there is less time to establish the necessary differential voltage on the bit lines to insure proper reading of the digital information. Thus, in some applications, the complementary pair of bit lines are not enable long enough to produce a sufficient differential voltage for the sensing amplifier to accurately read the data, which causes errors in the retrieval of the digital information from the memory system. Additionally, the synchronization technique adds delays to the retrieval of data from a memory cell. Delay, or set-up time, is introduced by waiting for transitions in the clock cycle even though the circuitry may be ready to retrieve data well before the next clock cycle transition. As such, a memory system utilizing a synchronization technique may be somewhat time inefficient for nominal processing speeds and may be inaccurate for high processing speeds.

The self-resetting technique begins synchronously with the clock signal when an address signal is received, but thereafter it is asynchronous to the clock. In essence, after the address is decoded, the self-resetting technique is based on the speed of the circuitry and pre-established delay times independent of the clock. After decoding the address, the word line is enabled and a predetermined time later, the sense enable signal is activated. Concurrent to the activation of the word line, precharging of the bit line is disconnected such that data can be read from the bit line when the sense enable signal is activated. The predetermined time is established to ensure that the bit lines will have a sufficient time to charge, or discharge, for proper reading by the sense amplifier. While this technique operates at the speed of the circuitry independent of the clock, thereby overcoming the delay problems of the synchronization technique, it too is not without limitations. For example, if the clock cycle rate is reduced for diagnostic testing of the circuit employing the memory system, or due to process variations, the data may be read too early resulting in an error. Additionally, by having the predetermined time fixed, the self resetting technique does not take advantage of a slower clock to produce a greater bit line margin.

Therefore, a need exists for a method and apparatus that allows data to be retrieved from a memory system in a single clock pipelined without the delays introduced by the synchronization technique and takes advantage of slower clock rates to increase bit line margin.

DETAILED DESCRIPTIONS OF THE DRAWINGS

Generally, the present invention provides a method and apparatus for providing single clock cycle pipelined access of a memory system which takes advantage of varying clock rates to enhance bit line margins. This is accomplished by providing an array of memory cells that are arranged into columns and rows and intercoupled by bit lines and word lines. The memory system also includes an address decoder and a sense enable circuit. In operation, the address decoder, upon receiving an address, interprets the address and subsequently enables a word line (or word lines in a multi-column memory array) and disables precharging of a bit line, or bit lines. Once the word line is enabled, the sense enable circuit generates a sense enable signal from a transitional edge of a clock signal. When the sense enable signal is active, the sense amplifier reads the data from the addressed memory cell via the bit lines to produce the output data. As such, the sense enable signal is the result of ANDing the clock signal and the word line representation, but with a fixed duration. With such a method and apparatus, the present invention provides single clock cycle pipeline memory access with a self resetting sense enable signal to insure that the bit lines will reach an acceptable level for accurate data retrieval.

Figure 1:
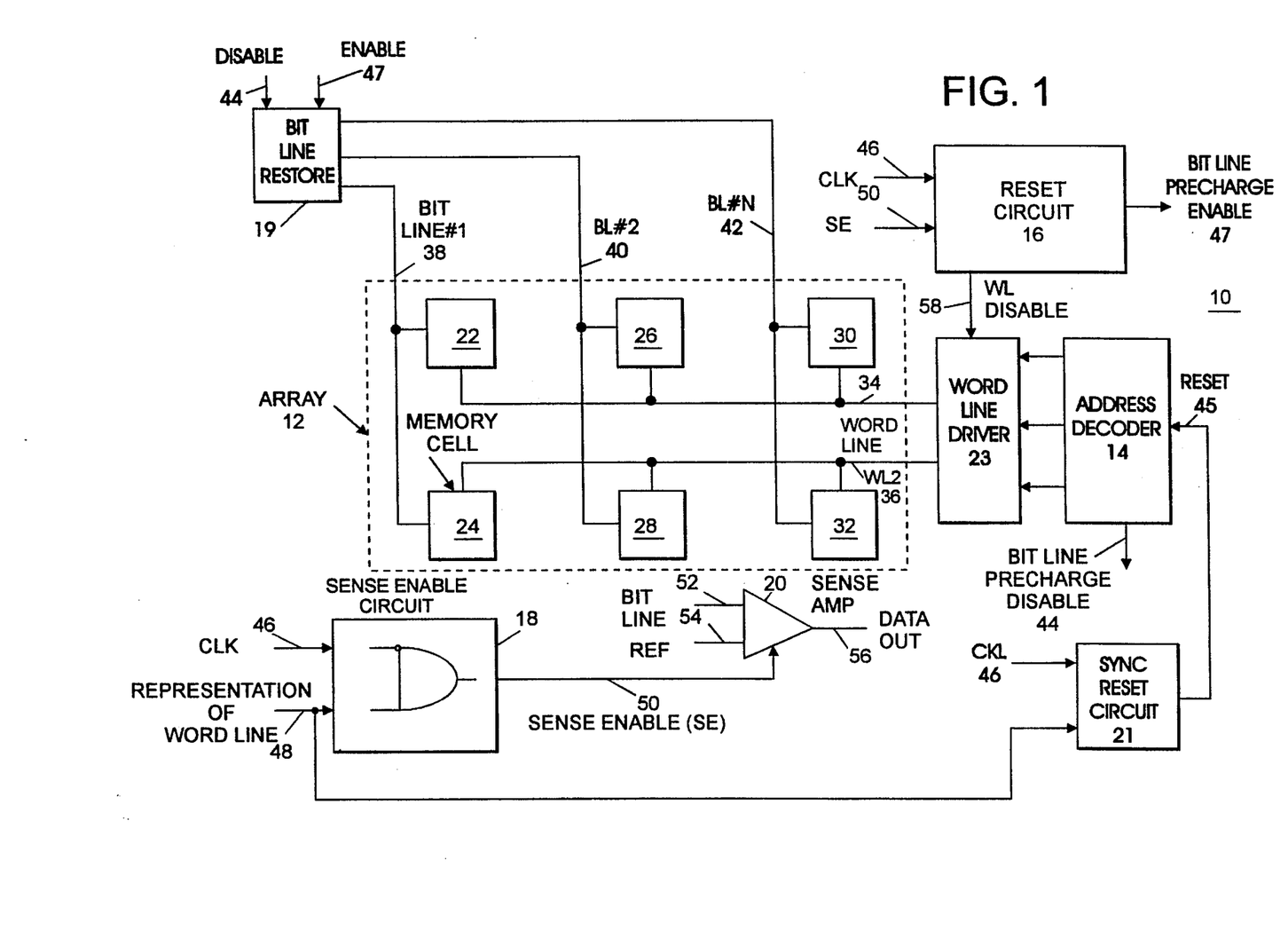
FIG. 1 illustrates a schematic block diagram of a memory system in accordance with the present invention.

FIG. 1 illustrates a memory system 10 that includes a memory array 12, an address decoder 14, a reset circuit 16, a sense enable circuit 18, a bit line restore circuit 19, a sense amplifier 20, a synchronized reset circuit 21, and a word line driver 23. The memory array 12 includes a plurality of memory cells 22–32 which are arranged into columns and rows and interconnected by a plurality of bit lines 38–42 and word lines 34–36. To access a particular memory cell, such as memory cell 24, precharging of bit line 38 is disabled, via bit line restore circuit 19, and word line 36 is enabled, via word line driver 23. Under these conditions, the bit line 38 will be coupled to the sense amplifier as bit line input 52. When the sense enable signal 50 is activated, the sense amplifier 20 compares the bit line input 52 with a bit line reference 54. Depending on the orientation of the sense amplifier inputs, the data output 56 will be a logic 1 or logic 0 when the bit line input 52 is greater than the bit line reference 54.

The overall operation of the memory system 10 begins when the address decoder 14 receives an address. Upon receipt of the address, the address decoder 14 decodes the address to identify at least one word line to be activated, and at least one bit line to be activated, i.e., precharging disabled. The word line representation 48 and a clock signal 46 are provided as inputs to the sense enable circuit 18 which, when the clock signal 46 has transitioned to its active state and the word line, or representation of the word line 48, is active, the sense enable circuit 18 activates the sense enable signal 50. As mentioned in the preceding paragraph, with the sense enable signal 50 activated, the sense amplifier 20 compares the bit line input 52 with the bit line reference 54 to produce the data output 56.

As the data is being read from the memory array 12, the reset circuit 16 receives the clock signal 46 and the sense enable signal 50 as inputs. A delay after the sense enable signal has been enabled, the reset circuit 16 generates a word line disable signal 58 and a bit line precharge enable signal 47. The word line disable signal is coupled to the word line driver 23 which deactivates the word line signal it has previously activated. A second delay after the sense enable signal 50 is enabled, the reset circuit 16 generates a sense disable signal which disables the sense enable signal 50. In addition, the synchronized reset circuit 21 receives the clock 46 and the word line representation 48 and generates therefrom an address decoder reset signal 45. The reset signal 45 resets the address decoder 14 such that it is ready to decode another address.

Figure 2:
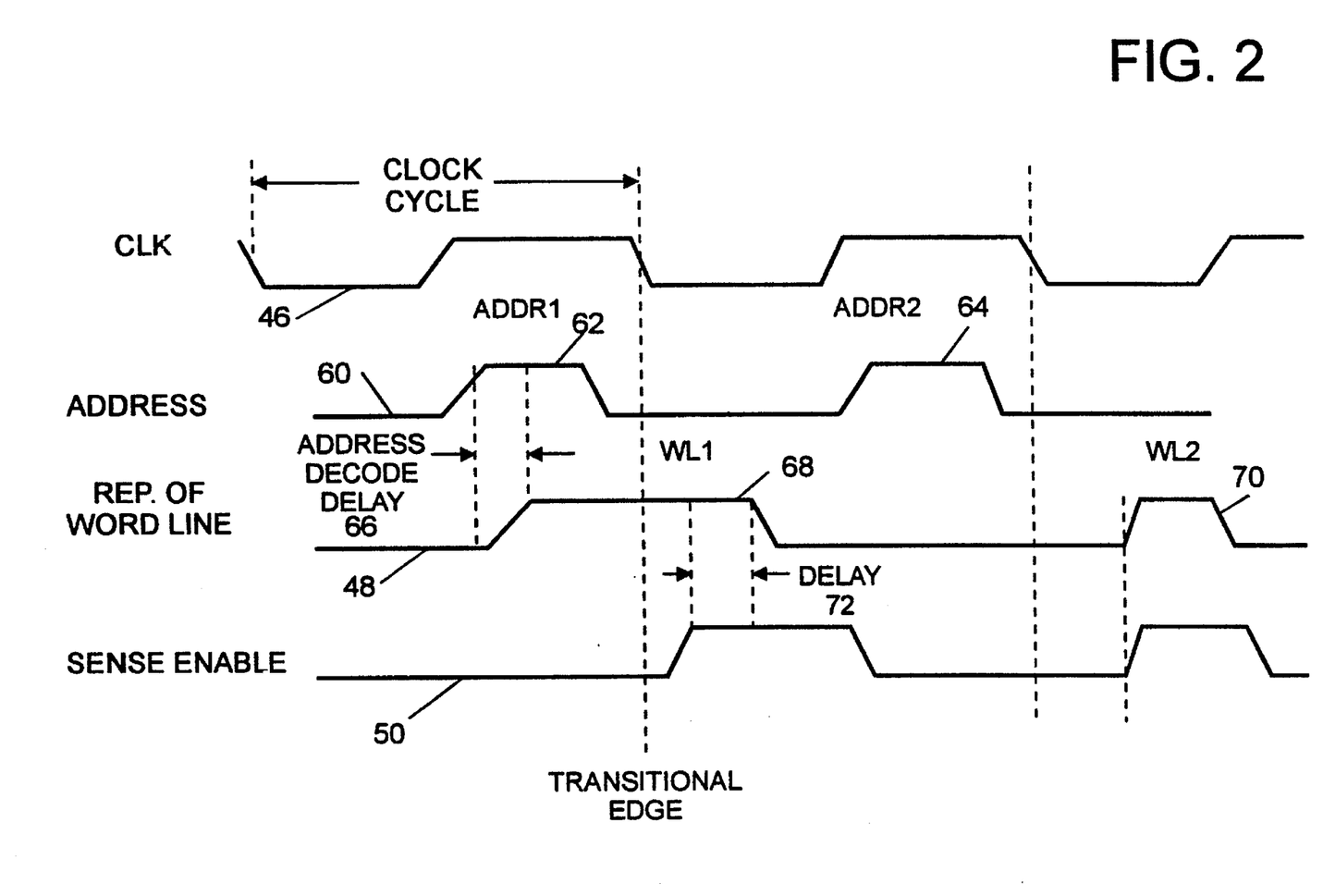
FIG. 2 illustrates a timing diagram of the memory system of FIG. 1.

FIG. 2 illustrates a timing diagram of the synchronized and self-resetting concepts employed by the memory system 10 of FIG. 1. As shown, the clock 46 includes a clock cycle and is shown to have transitional edges when the clock signal changes from a logic high to a logic low state and vice versa. The address signal 60 is received in the first clock cycle and is decoded by the address decoder 14. Due to circuit limitations of the address decoder 14, there is an address decode delay time 66. Immediately subsequent to this address delay time 66, the address decoder 14 activates the word line which is shown as a representation of word line 48. As one skilled in the art will readily appreciate, the representation of the word line 48 may be the actual word line ORed together with other word lines to provide the input to the sense enable circuit. Alternatively, the representation of the word line may be a dummy word line generated by the address decoder or a dummy bit line generated by the address decoder. Regardless of the particular representation of the word line used, the activation of the word line is provided to the sense enable circuit 18 as an input.

As shown with respect to a first address 62 being received, the representation of the word line 48 is activated prior to the transitional edge of the clock 46. Giving this condition, the sense enable signal 50 is generated at the transitional edge of the clock cycle. For the purposes of this application, the transitional edge of a clock signal will include the transitional edge through the duration of the subsequent clock phase. Thus, for a 300 Mhz clock having a clock duration of 3.3 nanoseconds, the transitional edge will include the transitional edge and the next 1.7 nanoseconds, or until the next transitional edge.

As is also shown in FIG. 2, the first word line 68 is deactivated a delay 72 after the sense enable signal 50 has been activated. The delay 72 is generated by the synchronized reset circuit 16 and is a fixed delay, i.e., it utilizes the self-resetting concept. The sense enable signal is also reset a predetermined time after its enablement. Thus, the present invention combines the self-resetting concept with the synchronization concept in that the sense enable signal is not enabled until both the word line and the clock signal are in an active state and then the word line and the sense enable signal are deactivated a predetermined time after the sense enable signal has been activated. This allows the memory system of the present invention to take advantage of faster circuitry and/or a slower clock rate to provide a greater bit line margin. As is known, the greater the bit line margin, i.e., the voltage differential between a bit line and a complimentary bit line, or a bit line reference, the more accurately the sense amplifier can read the data.

Continuing with the discussion of FIG. 2, when a second address 64 is received, the address decoder 14 decodes the address and enables a second word line 70. In contrast to the generation of word line 1, the generation of word line 2 occurs after the transitional edge of the clock cycle. Given this situation, the sense enable circuit, which comprises an ANDing function of the clock 46 and the representation of the word line 48, does not enable the sense enable signal 50 until the word line is activated. Note that, if the word line representation is not activated, the sense enable signal will not be generated.

Figure 3:
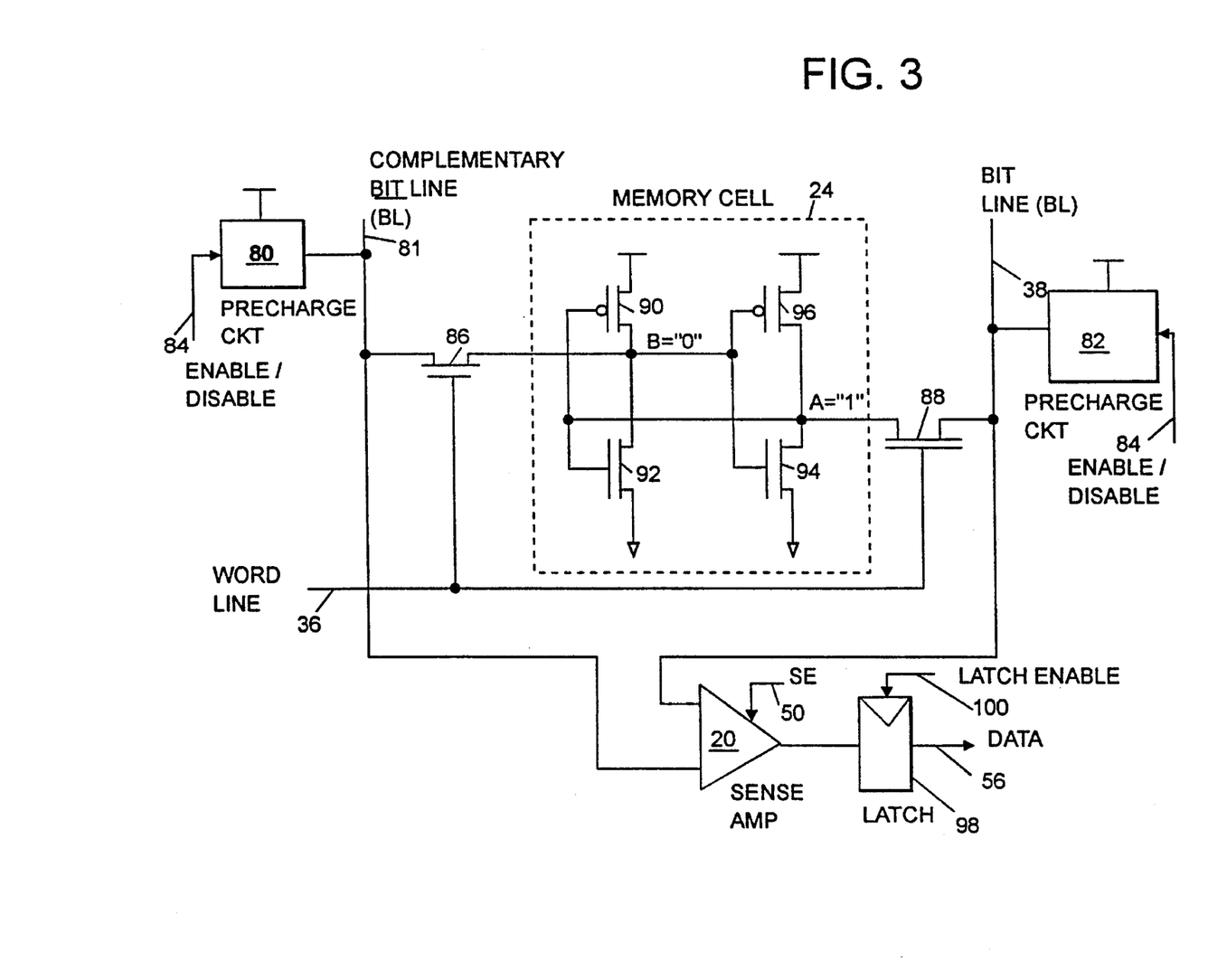
FIG. 3 illustrates a detailed portion of the memory system of FIG. 1.

FIG. 3 illustrates a portion of the memory system 10 with the further addition of complementary bit lines. As shown, the memory cell 24 includes a pair of inverters. Each of the inverters includes P-channel field effect transistors (FET) 90 and 96, and N-channel FETs 92 and 94. The transistors 90–96 are interoperably coupled to provide a cross-coupled invertor, or buffer stage. The memory cell 24 is coupled to the bit line 38 and complementary bit line 81 via transistors 86 and 88. Transistors 86 and 88 are activated upon activation of word line 36. The bit lines 38 and 81 are precharged to a predetermined value (e.g. Vdd) via precharge circuits 80 and 82. Note that activation of the address decoding process is used to generate the enable/disable signal 84 which, when active, disables precharging of the bit lines.

When the word line 36 is enabled, transistors 86 and 88 are "on", the precharged circuits 80 and 82 are disabled such that the information stored in memory cell 24 is provided as inputs, via the bit lines 38 and 81, to the sense amplifier 20. The output of the sense amplifier is then latched into latch 98 via a latch enable signal 100 to produce the output data 56.

Figure 4:
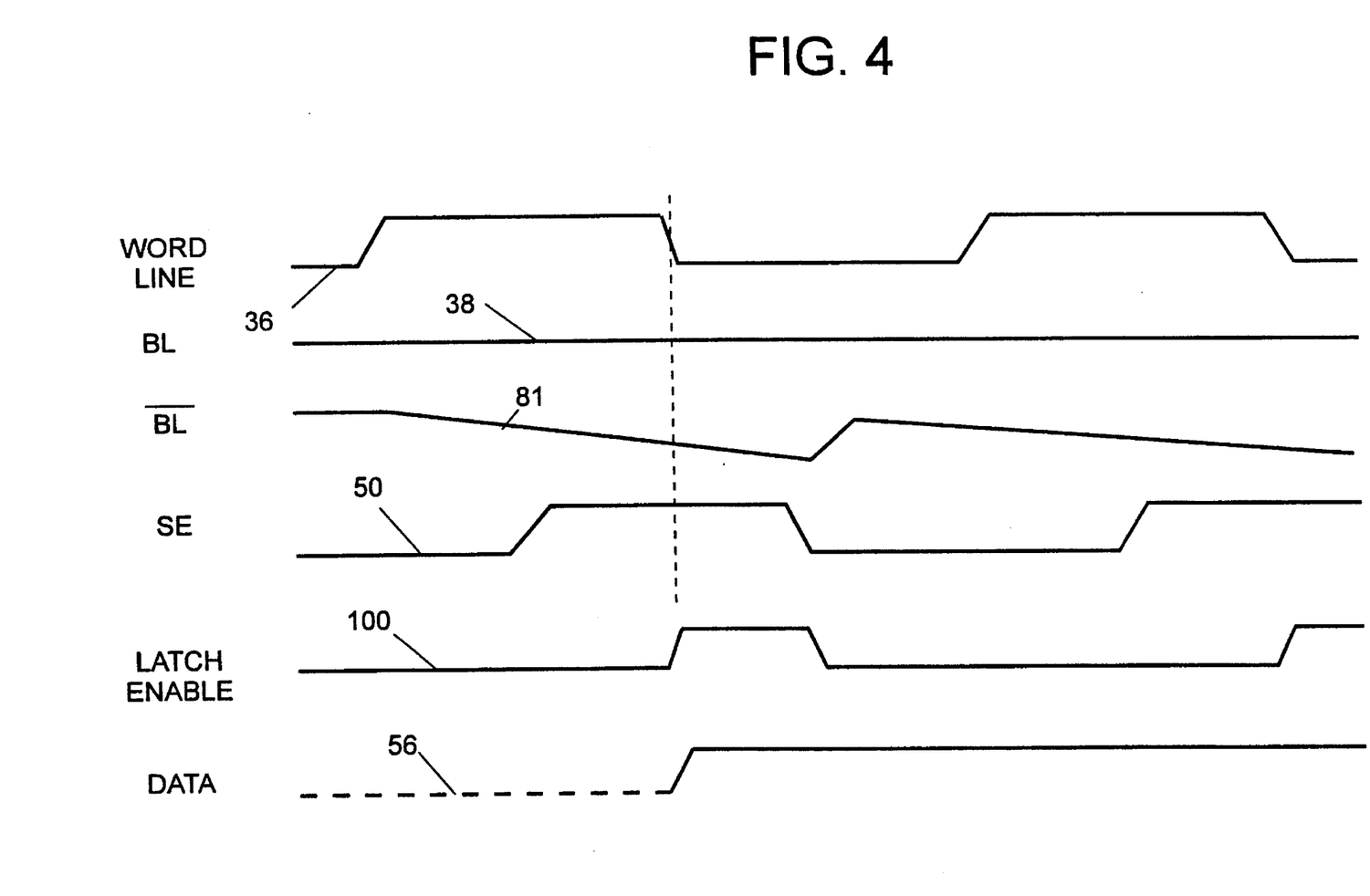
FIG. 4 illustrates a timing diagram of the memory system of FIG. 3.

FIG. 4 illustrates a timing diagram of the memory access of the memory cell 24 of FIG. 3. FIG. 4 also assumes that the memory cell, at node B, which is the node that couples transistor 90 and 92, is storing a logic 0, while node A, which couples transistor 94 to 96, is providing a logic 1. The timing diagram of FIG. 4 further presupposes that the digital information being stored in memory cell 24 is the information at node A. Given these presumptions, as word line 36 is enabled, the enable/disable signal 84 is activated such that precharge is disabled and the bit lines are coupled to their respective nodes. As shown, bit line 38 is coupled to node A and produces bit line signal 38, while complementary bit line 81 is coupled to node B and produces bit line signal 81. As further shown, bit line signal 81 has a decreasing potential due to the fact that node B is storing a logic 0. When the sense enable signal 50 is activated, the sense amplifier compares the differential voltage between the bit line signal 38 and the complementary bit line signal 81. When the latch enable signal 100 is activated, data 56 is latched into the latch 90 which may then be provided to external circuitry.

An advantage of the present invention allows for variations in the speed of the memory system to be capitalized upon. For example, in a system where the word line can be generated quickly due to process variations or design enhancements, the bit lines are activated such that when the sense enable signal is produced, the differential voltage between the bit lines is greater. In a purely synchronized system, this advantage cannot be realized.

Figure 5:
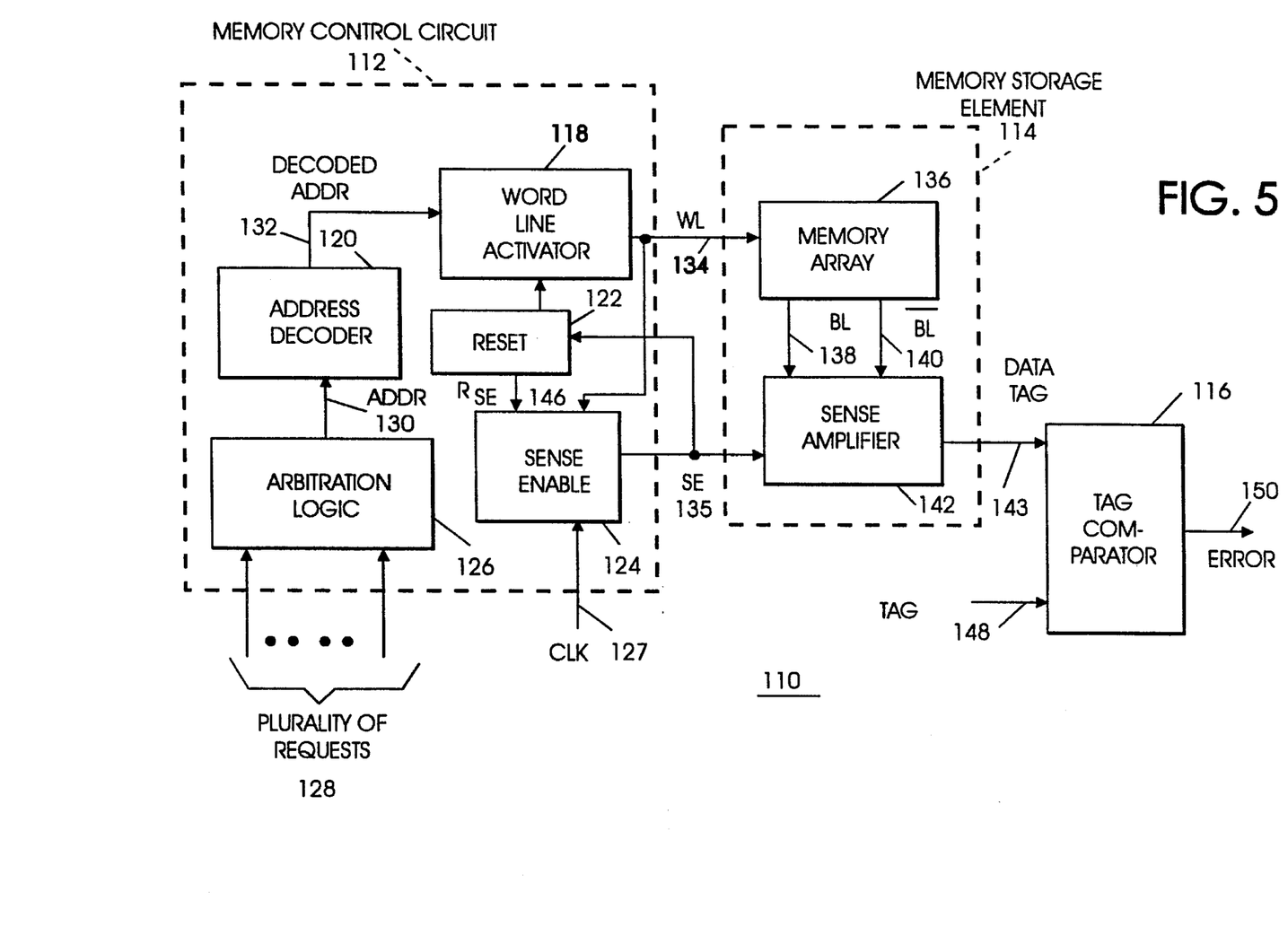
FIG. 5 illustrates an alternate embodiment of a memory system in accordance with the present invention.

FIG. 5 illustrates an alternate memory system that includes a memory control circuit 112, a memory storage element 114, and a tag comparator 116. The memory control circuit 112 receives a plurality of memory access request 128 via arbitration logic 126. The arbitration logic 126 utilizes an arbitration protocol to select one of the plurality of request 128 as the one to be processed. Having selected this, the arbitration logic 126 interprets the request to produce address 130. Address 130 is routed to the address decoder 120 which decodes the address to identify at least one word line and one bit line to activate. This is represented as a decoded address 132. The decoded address 132 is subsequently routed to word line activator 118 which activates word line 134 and at least one bit line. The word line 134 is coupled to the sense enable circuit 124 as is a clock signal 127. The sense enable circuit 124, similar to the sense enable circuit 18 of FIG. 1, generates the sense enable signal 135. The sense enable signal 135 is coupled to a reset circuit 122 wherein the reset circuit resets the word line and the sense enable signal using a self-resetting technique. The reset signals produced by the reset circuit 122 are shown as word line reset 144 and sense enable reset 146.

The word line signal 134 and sense enable signal 135 are routed to the memory storage element 114. The word line 134 is utilized to access a memory cell within a memory array 136. Outputted from the memory array 136 are bit lines 138 and 140 which are received as inputs by a sense amplifier 142. The sense amplifier, upon receipt of an active sense enable signal 135 compares the bit line signals 138 and 140 to produce data output 143. The data tag, or data output, 143 is compared to a stored tag 148 via tag comparator 116. If the tag data 143 does not match the stored tag 148, the tag comparator 116 generates an error 150. One skilled in the art will readily appreciate that the tag error detection circuit employed in FIG. 5 is readily known within the art. Thus, no further discussion will be presented with regard to the tag comparator 116.

Figure 6:
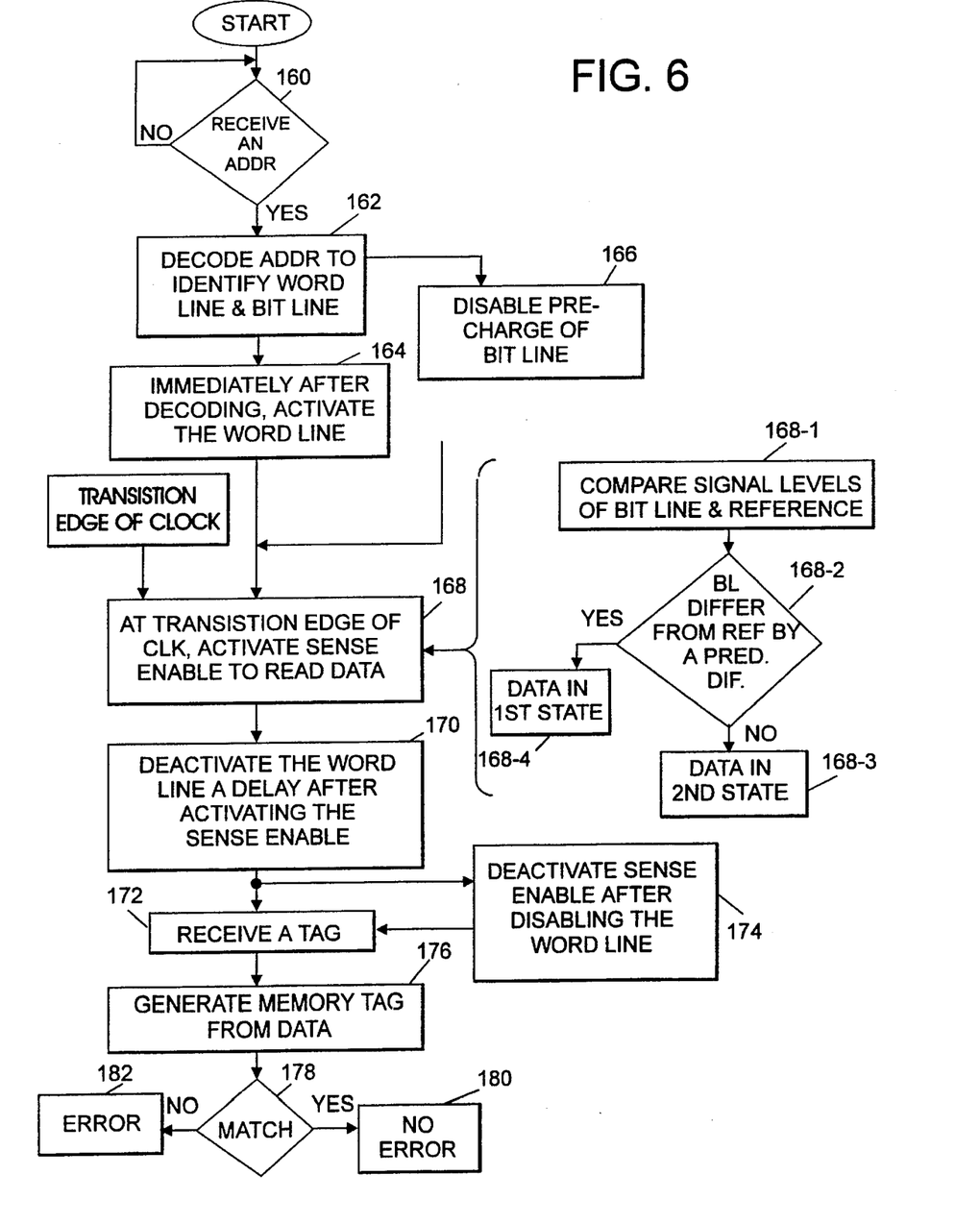
FIG. 6 illustrates a logic diagram which may be used to implement a memory system in accordance with the present invention.

FIG. 6 illustrates a logic diagram which may be used to implement a memory storage device in accordance with the present invention. At step 160, the memory system determines whether it has received an address. If not, the memory system waits until an address is received. When an address is received, the process proceeds to step 162 wherein the address is decoded to identify at least one word line and at least one bit line. Having decoded the address, the process concurrently proceeds to steps 164 and 166. At step 164, immediately after decoding the address, the word line is activated. As previously mentioned, there is an address decode delay time which prevents the word line from being activated immediately upon receipt of the address. At step 166, the precharging of the bit lines is disabled such that the bit lines can be used to read the data in the addressed memory cell.

The process continues at step 168 wherein at a transitional edge of the clock, the sense enable signal is activated such that data may be read. As mentioned above, the transitional edge of the clock includes the transition edge plus the duration of the next clock phase. As also mentioned above the sense enable signal is not activated unless the word line is active and the clock is in an active state following a transitional edge. An active state, as one skilled in the art will readily appreciate, can be either when the clock is in a logic high state or a logic low state.

To read the data, the process proceeds to step 168-1 wherein the bit line signal is compared to a reference. In a differential bit line circuit, the reference is the complementary bit line. Having made the comparison, the process proceeds to step 168-2 wherein a determination is made as to whether the bit line differs from the bit line reference by a predetermined amount (100–500 mV). If yes, the process proceeds to step 168-4 where the data is read to be within a first state. If the difference between the bit line and the reference is not greater than a predetermined amount, the process proceeds to 168-3 wherein that data is read to be in a second state. As one skilled in the art will readily appreciate, depending on how the comparison is achieved, the first state may be a logic high while the second state is a logic low or vice versa.

Having read the data, the process proceeds to step 170 wherein the word line is deactivated and precharging of the bit lines is re-enabled a delay after the sense enable circuit is enabled. The delay used is a predetermined time based on the rate of the clock signal. After deactivating the word line, the process proceeds to the concurrent execution of steps 172 and 174. At step 172, a stored tag signal is received. At step 174, the sense enable signal is deactivated subsequent to the word line being deactivated and is deactivated based on a predetermine amount of time. Thus, both the word line and the sense enable signal are deactivated utilizing a self-resetting technique and the sense enable signal is activated using a combination of the synchronous and self-resetting techniques.

The process proceeds to step 176 wherein a memory tag is generated from the data which has been read. The process then proceeds to step 178 where the newly generated tag information is compared with the stored tag. If the tags match, the process proceeds to step 180 where no errors are identified. If, however, the tags do not match, the process proceeds to step 180 where an error is identified.

The present invention provides a method an apparatus for one clock cycle pipelining access of a memory system but further includes self-resetting techniques to insure that the data will be properly read from the memory cell. As described above, the present invention incorporates a combination of a synchronized technique with the self-resetting technique to insure that single clock cycle pipelining access may be obtained but also insuring that the voltage on the bit lines will have a sufficient value to insure that the sense amplifier can properly read the data. This allows memory systems to capitalize on process variations and reduced clock rates to enhance bit line margin.

What is claimed is:

1. A memory system having synchronized pipeline data access, the memory system comprising:

a plurality of memory cells arranged into an array, wherein a memory cell of the plurality of memory cells is addressed via a word line and a bit line;

address decoder operably coupled to the plurality of memory cells, the address decoder activates the word line and disconnects precharge of the bit line when an address for the memory cell is received, wherein the address decoder activates the word line immediately subsequent to decoding the address;

sense enable circuit operably coupled to receive a clock signal and a representation of the word line, the sense enable circuit generates a sense enable signal when the word line is activated and at a transitional edge of the clock signal; and sense amplifier operably coupled to sense data stored in the memory cell when the sense enable signal is active, such that memory cell access may span two clock cycles while still pipelining at a single clock frequency with maximum bit line margin.

2. The memory system of claim 1 further comprises reset circuit operably coupled to the address decoder, the reset circuit resets the word line a delay after the sense enable circuit generates the sense enable signal.

3. The memory system of claim 1, wherein the plurality of memory cells are connected to the array by differential bit lines.

4. The memory system of claim 3, wherein the sense amplifier further comprises differential input to receive information from the differential bit lines, such that the data can be read from the memory cell.

5. The memory system of claim 1, wherein the address decoder further comprises an arbitrator that selects at least one of a plurality of data requests to provide the address.

6. The memory system of claim 1, wherein the address decoder has an input connected to a reset circuit from which the word line disable signal is produced.

7. The memory system of claim 1, wherein the representation of the word line comprises ORing the word lines, a dummy word line, or a dummy bit line.

8. A method for provided synchronized pipeline access of a memory system, the method comprises the steps of:

a) upon receiving an address, decoding the address to identify at least one word line and at least one bit line;

b) immediately subsequent to the decoding, activating the at least one word line;

c) disconnecting precharge of the at least one bit line;

d) ANDing a clock signal with the at least one word line, such that at a transitional edge of the clock signal with the word line active, a sense enable signal is activated such that data is read from the memory via the at least one bit line; and e) deactivating the at least one word line a delay after activating the sense enable.

9. The method of claim 8 further comprises the steps of:

receiving a tag;

generating a memory tag from the data read from the memory; and comparing the tag with the memory tag to identify an error.

10. The method of claim 8 further comprises the step of deactivating the sense enable subsequent to the deactivating the at least one word line.

11. The method of claim 8, wherein step (d) further comprises the steps of:

comparing signal level of the at least one bit line with a reference bit line;

when the signal level of the at least one bit line is at least a predetermined difference from the reference bit line, interpreting the data to be in a first logic state; and when the signal level of the at least one bit line is not at least the predetermined difference from the reference bit line, interpreting the data to be in a second logic state.

12. The method of claim 11, wherein the step of comparing the signal level further comprises comparing the signal level of the at least one bit line with a signal level of a complimentary bit line, wherein the signal level of the complimentary bit line provides a reference level.

13. A memory system having pipeline access, the memory system comprising:

a memory storage element that includes a sense amplifier;

a memory control circuit that receives a plurality of data access requests and grants access to retrieve data from the memory storage element to one of the plurality of data access requests based on an arbitration protocol, the memory control circuit includes:

address decode means for decoding an address from the one of the plurality of data access requests to produce a decoded address;

word line means for activating, immediately subsequent to decoding the address, a word line identified by the decoded address and disabling precharge of a bit line;

sense enable means for activating a sense enable signal when the word line is active and at a transitional edge of a clock cycle; and reset means for deactivating the word line a delay after the activating the sense enable signal and re-establishing the precharge of the bit line.

14. The memory system of claim 13 further comprises a tag comparison circuit operably coupled to the memory storage element and to receive a tag, the tag comparison circuit generates a data tag from data retrieved from the memory storage element and compares the data tag to the tag for errors.

15. The memory system of claim 13, wherein the reset means further functions to deactivate the sense enable signal subsequent to the disabling the word line.

16. The memory system of claim 13, wherein the sense amplifier further comprises a differential input which is operably coupled to a bit line and complimentary bit line.

* * * * *